United States Patent [19]

McBride et al.

[11] Patent Number: 4,707,378

[45] Date of Patent: Nov. 17, 1987

[54] METHOD AND APPARATUS FOR CONTROLLING THE ORGANIC CONTAMINATION LEVEL IN AN ELECTROLESS PLATING BATH

[75] Inventors: Donald G. McBride, Binghamton; Robert G. Rickert, Endwell, both of N.Y.

[73] Assignee: International Business Machines Corporation, Armonk, N.Y.

[21] Appl. No.: 884,330

[22] Filed: Jul. 11, 1986

[51] Int. Cl.⁴ ............................................. C23C 18/40
[52] U.S. Cl. ....................................... 427/8; 118/689; 118/690; 118/423; 204/1 T; 204/434; 427/443.1
[58] Field of Search ................. 427/8, 443.1; 118/689, 118/690, 423; 204/1 T, 434

[56] References Cited

U.S. PATENT DOCUMENTS

| | | | |
|---|---|---|---|
| 4,152,164 | 5/1979 | Gulla | 427/345 |
| 4,326,940 | 4/1982 | Eckles | 427/8 |
| 4,331,699 | 5/1982 | Suzuki | 427/8 |
| 4,353,933 | 10/1982 | Araki | 427/8 |
| 4,626,446 | 12/1986 | Capwell | 427/8 |
| 4,631,116 | 12/1986 | Ludwig | 204/1 T |

Primary Examiner—John D. Smith
Attorney, Agent, or Firm—Pollock, Vande Sande & Priddy

[57] ABSTRACT

An electroless plating bath is selectively cleaned of organic contaminants. The organic contaminants are detected by measuring the capacitance between a working electrode and counter electrode with a potentiostat. The capacitance measurements are used to indicate the level of organic contaminants. Exposure of the dummy plating surface in the electroless plating bath is controlled such that the exposed surface is directly proportional to the detected level of organic contaminants.

10 Claims, 3 Drawing Figures

METHOD AND APPARATUS FOR CONTROLLING THE ORGANIC CONTAMINATION LEVEL IN AN ELECTROLESS PLATING BATH

The present invention relates to the electroless plating art. Specifically, an apparatus and method for monitoring and controlling the organic contaminant level in an electroless plating bath are described.

Electroless plating baths are utilized in the manufacture of integrated circuits. During the manufacture of integrated circuits, substrate circuit interconnections are plated, using an electroless plating bath so that the interconnections receive a copper layer. The quality of plated circuit interconnections depends on maintaining the bath chemistry precisely controlled and free of contaminants. Many constituent parameters in the electroless copper additive plating bath are currently measured and controlled. Typically, the level of $CU^{++}$, HCHO, NaOH (pH), EDTA, $CN^-$ and $O_2$ are controlled. Also, the temperature of the bath is accurately controlled. Systems for agitating the bath are also employed to maintain the bath consistency.

The contaminants contained in the electroless plating bath are both inorganic, such as $SO_4^-$ and $HCOO^-$, as well as organic. Control over the inorganic contaminants is usually maintained by periodically measuring the specific gravity of the bath. When the specific gravity is outside a given tolerance known for producing quality plating, the bath can be changed or otherwise purified.

Organic contaminants are not usually controlled. These organic contaminants include photoresist and epoxy leachate which are introduced into the bath from the circuit substrates. Removal of these contaminants has not in the past been practical. The present invention proposes to measure these levels and effect control over the level of these contaminants.

SUMMARY OF THE INVENTION

It is an object of this invention to measure the level of organic contaminants contained in an electroless plating bath.

It is a further object of this invention to maintain the level of organic contaminants at a predetermined level in an electroless plating bath by plating contaminants onto a dummy plating surface.

It is a further object of this invention to avoid excessive cleaning of an electroless plating bath which will consume excessive quantities of bath constituents.

These and other objects of the invention are accomplished by the invention which provides for a cleaning of an electroless plating bath. Cleaning of the electroless bath can be achieved by loading the bath with dummy plating surfaces. The contaminants will be plated on the dummy plating surfaces, thus purifying the bath. Excessive cleaning of the bath, however, is avoided as it consumes excessive quantities of the plating bath constituents. The present invention loads the bath with only enough dummy panel plating surface to maintain the bath at a desired contaminant level known to provide high quality plated components.

The level of organic contaminants is determined by making periodic surface capacitance measurements of the electroless plating bath. The organic contaminants when plated onto a conductive surface vary the double layer capacitance of this surface. This double layer capacitance is a function of the level of contaminants in the plating bath. Therefore, by periodically sensing the double layer capacitance between a member in the electroless plating bath being plated and an immersed electrode, a measure of the contaminant level may be obtained.

In the preferred embdodiment of the invention, a positioner is located above the surface of the electroless plating bath to position a dummy plating surface in the electroless plating bath. The positioner is operated in a closed loop with a potentiostat which makes complex impedance measurements between a working and counterelectrode submerged in a representative sample of the plating bath. The control loop is such as to increase or decrease the surface area of a dummy panel which is positioned in the electroless plating bath. As the organic contaminant level increases, the surface area of the dummy panel exposed in the bath is increased to effectively plate out the organic contaminants in the electroless plating bath. As the contaminant level decreases, below a predetermined level, less surface area of the dummy panel is exposed to the bath. By controlling the amount of dummy panel surface area exposed to the electroless plating bath to achieve a desired contaminant level, excessive cleaning of the bath which consumes excessive quantities of bath constituents is avoided.

DESCRIPTION OF THE PREFERRED EMBODIMENT

Figure 1:
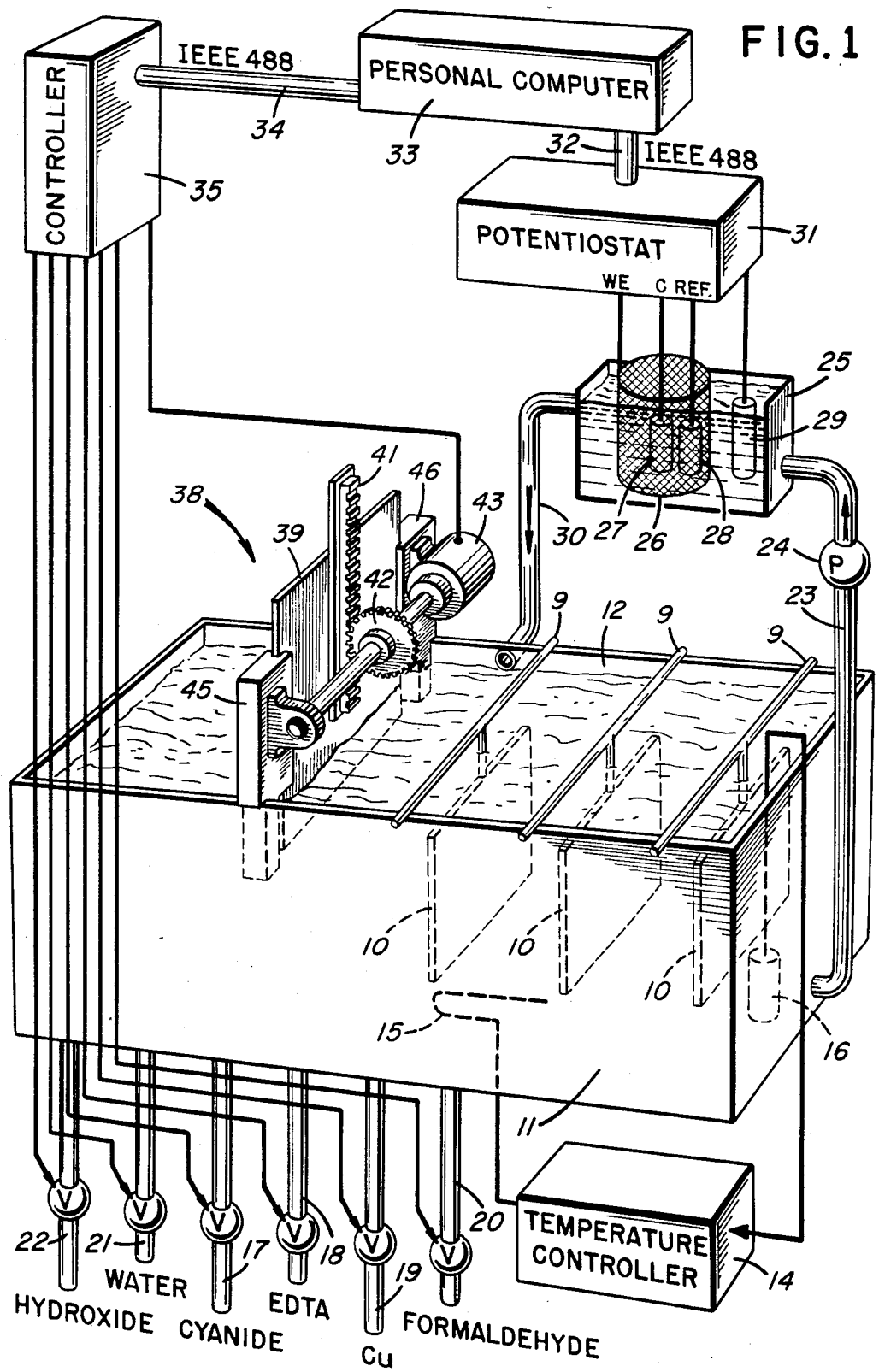
FIG. 1 is a block diagram illustrating an electroless plating bath which includes dummy loading to remove organic contaminants of the electroless plating bath in accordance with the preferred embodiment.

Referring now to FIG. 1, there is shown an apparatus for carrying out the method in accordance with the invention. An electroless plating bath 11 is shown for plating a plurality of substrates 10 in an additive copper plating bath. Substrates 10 are supported in reservoir 12 with a plurality of support members 9. Associated with the additive plating bath is a temperature controller 14, connected to a sensing thermistor 16 and to a heating element 15. The temperature of the bath is maintained within pre-established limits to obtain a desired plating quality.

The bath 11 is replenished through a plurality of inlet conduits 17, 18, 19, 20, 21 and 22. The additive copper bath consists of EDTA, Cu, and formaldehyde as constituent chemicals. The bath chemistry for which the present invention is advantageously utilized is as follows:

bath temperature: between 60° to 80° (preferable range)
plating rate: 0.05–0.2 mils per hour
EDTA concentration: 25–50 grams per liter
cyanide concentration: 5–45 parts per million
copper concentration: 5–20 grams per liter
specific gravity: 1.03–1.08
pH: 11.0–13.0
formaldehyde concentration: 0–19 grams per liter The above concentrations of EDTA, Cu, cyanide and formaldehyde may be controlled either manually or through an autocontrol loop, the subject of which is not part of the present invention. Control over pH is effected by controlling hydroxide levels. Specific gravity is controlled by water level control. The above plating bath should be maintained as precisely as possible for optimum plating quality.

A second testing reservoir 25 receives the electroless plating bath through a pump 24 and conduit 23 and returned to the main bath 11 by conduit 30. The reservoir 25 will permit accurate measurements of the plating bath electrical characteristics, utilizing a conventional potentiostat 31. Potentiostat 31 includes a working electrode 26, counter electrode 27 and reference electrode 28. The potentiostat can also accurately monitor the pH of the plating bath through sensor 29. The potentiostat 31, for instance, may be a Model 173EG&G potentiostat/galvanostat, commonly used in process controls for plating baths. The potentiostat 31 includes a digital output which is compatible with an IEEE 488 communication link 32. The output of the potentiostat 31 is connected through the aforesaid communication link to a personal computer 33, also equipped with an IEEE 488 interface.

The computer is programmed in a manner to be explained to command the potentiostat 31 to apply an AC voltage between the working electrode 26 and reference electrode 28. Using the working electrode 26 and reference electrode 28 AC potential, it is possible to measure the resulting current flowing through the bath between the working electrode 26 and counter electrode 27 with the potentiostat. Utilizing the AC voltage and resulting current measurements, a complex impedance measurement for the double layer capacitance of the working electrode may be ascertained.

It has been found experimentally that the level of organic contaminants in the electroless plating bath varies as the double layer capacitance measured between a surface being plated and the electroless plating bath. The change in double layer capacitance represents a level of organic materials which are deposited on a surface being plated.

The double layer capacitance is the capacitance of the Helmholtz double layer. It is known that when solids are immersed in a liquid, molecules adhere to the surface. Molecules are aligned on the surface in two layers due to electrical interaction with the surface. These layers exhibit a capacitance with respect to the metal surface.

Figure 2:
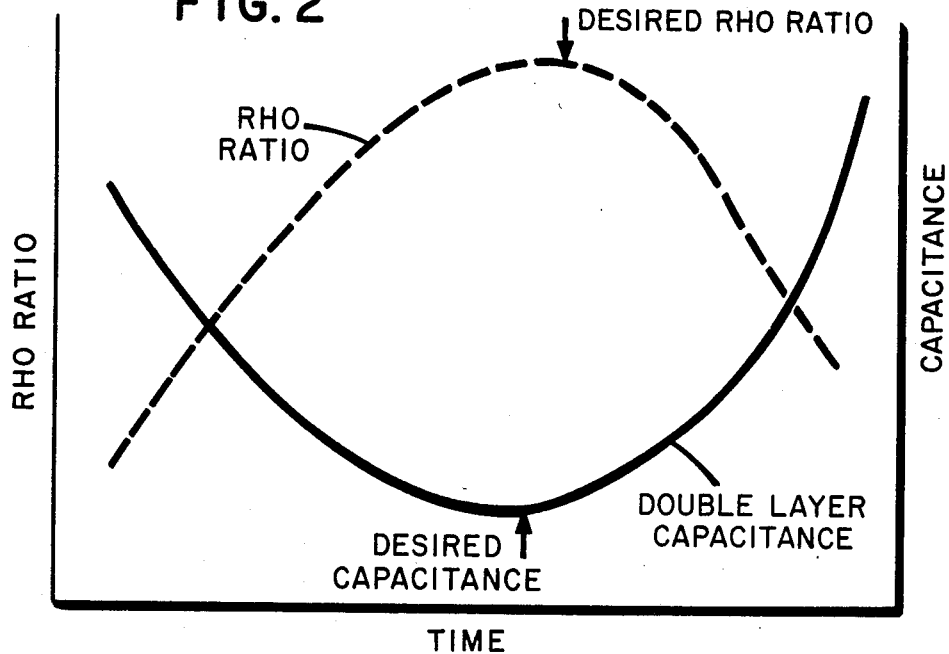
FIG. 2 illustrates the relationship between organic contaminants and the measured double layer capacitance of a surface disposed in the electroless plating bath.

Referring to FIG. 2, there is shown generally the contaminant level, represented as RHO ratio, versus a capacitance measured between an electrode and a surface being plated in the electroless plating bath. The RHO ratio has long been recognized as an indication of contaminant level in a plated surface. As used herein, the RHO ratio is the resistivity of the plated material in liquid nitrogen vs. the resistivity in ice water. The higher the RHO ratio, the lower is the concentration of contaminants in the plated surface. From the relationship of FIG. 2 between RHO ratio and double layer capacitance, it is possible to accurately monitor the level of organic contaminants contained in the electroless plating bath.

Shown in FIG. 2 is a desired RHO ratio and capacitance level experienced over time for the electroless plating bath being cleaned by a dummy plating panel. A desired RHO ratio can be achieved by inserting loading panels, referred to herein as dummy plating panels, into the electroless plating bath 11. This contaminant level represents a desired operating point for the bath. However, once the desired contaminant level is reached, it is advantageous not to excessively clean the bath by inserting more than the required amount of dummy plating area. Excessive cleaning of the plating bath requires excessive replenishment of the bath chemical constituents. Thus, as shown in FIG. 1, there is provided a positioner 38 which will insert a dummy panel 39, which may be copper, into the electroless plating bath 11. The positioner 38 will position the dummy panel 39 such as to increase the amount of surface area exposed to the bath as the process time increases to a maximum exposure. Loading the bath with the dummy panel 39 increases the RHO ratio to the desired RHO ratio. When a desired double layer capacitance is achieved, the desired RHO ratio has been reached. The positioner will withdraw the dummy panel 38 to avoid over cleaning the bath beyond that represented by the desired RHO ratio.

The peak desired RHO ratio is seen to be correlated with the minimum double layer capacitance. Periodic capacitance measurements will determine whether the desired RHO ratio has been obtained. Once the desired capacitance has been reached, the positioner will begin to remove the dummy panel to maintain the desired capacitance.

The positioner 38 includes a motor 43 which may be an indexible stepping motor operated from a controller 35. The positioner 38 is supported by supports 45 and 46 over the top of reservoir 12. The supports 45 and 46 include a channel for supporting a dummy panel 39. Attached to the dummy panel 39 is a rack 41 which meshes with gear 42. Gear 42, as is shown in the Figure, is driven by the stepping motor 43 to index the panel 39 into or away from the plating bath 11.

The control for operating the index motor 43 is derived from controller 35. Controller 35 is a Model 2400B fluke controller which interfaces with a second IEEE 488 interface 34. Thus, personal computer 33 can command the motor 43 to index the panel 39 such that more or less of the panel surface 39 is exposed to the electroless plating bath 11.

In operation, the potentiostat 31 will measure over time the AC impedance between the working electrode and the counter electrode 26 and 27. From this impedance its imaginary portion is derived by personal computer 33. The resulting imaginary component is further resolved into a capacitance value based on the frequency of the signal applied between the working electrode and reference electrodes 26 and 28. The measured capacitance is monitored over time. After each increment of a selected time, such as $\frac{1}{4}$ hour increments, the capacitance is checked with respect to a desired capacitance. In the event that the measured capacitance, after each of these increments of time, exceeds the desired capacitance, the motor 43 is indexed to expose a larger surface area of the dummy plating panel 39 to the electroless plating bath. The controller 35 employs a standard PID algorithm (proportional, integral derivative). As the system approaches the desired RHO ratio, less incremental increases in surface area exposure of panel 39 is provided.

Each succeeding $\frac{1}{4}$ hour increment of the process time for the electroless plating bath again results in a capacitance measurement being compared with a desired double layer capacitance. Once the desired double layer capacitance is reached, more or less dummy plating area 39 is exposed or removed from the electroless plating bath 11 to maintain the desired double layer capacitance. Thus, by selectively loading the electroless plating bath, a desired capacitance corresponding to a desired RHO ratio of organic contaminants is achieved representing neither an excessively cleaned bath or a higher than desired contaminant level.

Figure 3:
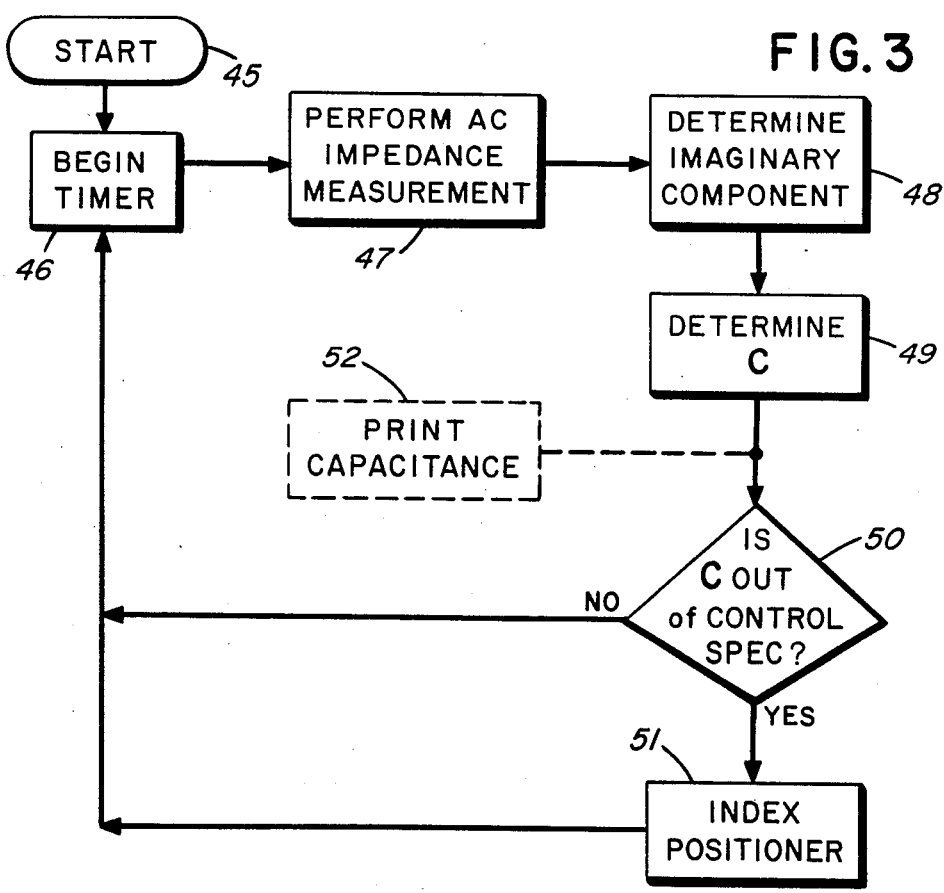
FIG. 3 illustrates the general programming steps executed by computer 33.

The foregoing process is carried out in accordance with a computer program configured as shown in FIG. 3. At the start of the plating procees 45, a timer 46 is enabled to indicated ¼ hour increments of the plating time. AC impedance measurements are conducted by the potentiostat 18 either on a continuous or incremental basis, in step 47, such that the quality of the plating bath vis a vis organic contaminants is known. Each of the impedance measurements is further reduced to an imaginary component 48, which includes a capacitance measurement.

The personal computer 19 will correlate the detected imaginary component with a predetermined relationship of organic contaminant levels to capacitance, such as is shown in FIG. 2. Step 49 will indicate where the system is operating along the double layer capacitance curve of FIG. 2. Decision block 50 will indicate when the double layer capacitance has departed from the desired capacitance and command the index positioner 38 to increase the exposure of dummy panel 39 to the electroless plating bath as departures from the desired capacitance are detected. In most electroless plating processes, the dummy locading 39 will be rapidly positioned stepwise in a continuous direction for maximum surface area exposure, reducing the time required to reach the desired double layer capacitance. Once the desired double layer capacitance is reached, the positioner will index in the reverse direction, exposing less of the dummy panel 39 to the plating bath 11 when the measured double layer capacitance decreases below the desired double layer capacitance indicating an excessively cleaned bath. when the capacitance begins to increase, indicating an increase in contaminants, more dummy panel 39 surface area exposure will occur.

The foregoing program steps may also include a command 52 to print measured capacitance data after each ¼ hour increment or additionally include an alarm which will indicate to the operator when the contaminant level has exceeded a tolerable level.

Thus, there has been described a technique for selectively loading an electroless plating bath to remove organic contaminants. With the apparatus and method in accordance with the present invention, not only are organic contaminants monitored, but the bath may be effectively loaded to avoid overloading but yet maintain the bath sufficiently free of organic contaminants to extend the useful life of the electroless plating bath.

What is claimed is:

1. A method for controlling contaminants in an electroless plating bath comprising:
    measuring the complex impedance between a potentiostat working electrode and counter electrode immersed in said electroless plating bath;
    determining from said complex impedance a capacitive reactance and double layer capacitance of said bath; and
    exposing a dummy plating panel in said plating bath such that the exposed area of said dummy plating panel varies as said double layer capacitance level varies, whereby said dummy plating panel exposed to said electroless plating bath will plate out contaminants in said bath, maintaining said contaminant level at a predetermined minimum level.

2. The method of claim 1 wherein said exposing step will insert a maximum surface area of said dummy plating panel into said bath until a desired double layer capacitance level is produced.

3. The method of claim 1 wherein said exposed surface area of said dummy panel is reduced once said desired double layer capacitance level is reached.

4. The method of claim 1 wherein said dummy plating panel is advanced in steps during periodical time intervals to reach a desired surface exposure.

5. The method of claim 1 further comprising recording at periodic intervals said double layer capacitance.

6. An apparatus for controlling for controlling organic contamination levels in an electroless plating bath comprising:
    a potentiostat having a working electrode and counter electrode disposed in said electroless plating bath; said potentiostat providing an AC voltage between said electrode for measuring the complex impedance of said bath;
    a dummy panel providing a surface area for plating out organic contaminants in said electroless plating bath;
    a dummy panel support for raising and lowering said dummy panel in said electroless plating bath;
    motor drive positioner for controlling said dummy panel support, whereby the amount of surface area of said dummy panel exposed to said bath is controlled; and,
    a computer controller connected to said potentiostat and to said motor drive assembly, said computer controller programmed to receive said potentiostat impedance measurements, and determine from said measurements a capacitance measurement which correlates to a contaminant level of said bath; said computer being further programmed to control said positioner to vary the amount of surface area of said dummy panel exposed in said electroless plating bath to reduce the amount of contaminants in said bath.

7. The apparatus of claim 2 wherein said computer is further programmed to print said capacitance measurements over time.

8. The apparatus of claim 6 wherein said computer controller commands said positioner to increase said dummy panel surface area exposed in said electroless plating bath to a maximum exposure level until a desired double layer capacitance level is achieved.

9. The apparatus of claim 8 wherein said computer controller reduces said dummy panel surface exposure to said bath to maintain said measured capacitance at said desired double layer capacitance level.

10. The apparatus of claim 9 wherein said dummy panel exposure into said bath is stepwise changed in periodic intervals.

* * * * *